United States Patent [19]
Kneer

[11] Patent Number: 6,147,002
[45] Date of Patent: Nov. 14, 2000

[54] PROCESS FOR REMOVING CONTAMINANT FROM A SURFACE AND COMPOSITION USEFUL THEREFOR

[75] Inventor: Emil Anton Kneer, Hilliard, Ohio

[73] Assignee: Ashland Inc., Ashland, Ky.

[21] Appl. No.: 09/318,814

[22] Filed: May 26, 1999

[51] Int. Cl.$^7$ .................................................. H01L 21/00
[52] U.S. Cl. ................................ 438/692; 134/3; 134/41; 216/38; 216/88; 252/79.3; 252/79.4; 438/754
[58] Field of Search .................................. 252/79.2, 79.3, 252/79.4; 216/38, 88, 89, 99; 438/691, 692, 693, 745, 754; 134/1.3, 2, 3, 41

[56] References Cited

U.S. PATENT DOCUMENTS

| | | | |
|---|---|---|---|
| 5,824,601 | 10/1998 | Dao et al. | 252/79.3 X |
| 5,885,476 | 3/1999 | Hong et al. | 252/79.4 X |
| 5,893,756 | 4/1999 | Berman et al. | 438/693 X |
| 6,044,851 | 4/2000 | Grieger et al. | 252/79.3 X |

*Primary Examiner*—William Powell
*Attorney, Agent, or Firm*—Pollock, Vande Sande & Amernick

[57] ABSTRACT

Particulate and metal ion contamination is removed from a surface, such as a semiconductor wafer containing copper damascene or dual damascene features, employing aqueous composition comprising a fluoride containing compound; a dicarboxylic acid and/or salt thereof; and a hydroxycarboxylic acid and/or salt thereof.

23 Claims, No Drawings

PROCESS FOR REMOVING CONTAMINANT FROM A SURFACE AND COMPOSITION USEFUL THEREFOR

TECHNICAL FIELD

The present invention relates to an acidic aqueous composition that is especially useful for removing particulate and metallic contamination from a surface. The present invention is especially useful for removing particulate and metallic contaminants from structures such as those used as interconnect structures in integrated circuit devices such as semiconductor wafers containing copper damascene and dual damascene features. The structures treated according to the present invention include those that have been previously planarized by chemical mechanical polishing.

BACKGROUND OF THE INVENTION

On VLSI and ULSI semiconductor chips, Al and alloys of Al are used for conventional chip interconnect/wiring material. However, more recently copper and alloys of copper have been developed as chip interconnect material. The use of copper and copper alloys results in improved device performance when compared to Al and its alloys.

In the fabrication of semiconductor devices, the metallic interconnect material or wiring such as the copper or its alloys is typically planarized after deposition.

Polishing slurries used for this planarization are typically aqueous suspensions comprised of a metal oxide abrasive (such as alumina), organic acids, surfactants, and a suitable oxidizing agent. This process is known as chemical-mechanical polishing (CMP). The oxidizing agent works to enhance mechanical removal of material via a corrosion assisted process. Such oxidizing agents employed in commercially-available or proprietary slurries are typically inorganic metal salts such as $FeNO_3$, or $KIO_3$, and also hydrogen peroxide, present in significant concentrations. Other chemicals added to slurries to improve dispersion or otherwise enhance performance often are organic acids (e.g. citric acid). Sodium, potassium, and iron salts and/or compounds are frequently used in slurry formulations, and significant amounts of these metal ion impurities can remain on the wafer after polishing and post-polish cleaning.

Therefore, a tendency exists for various particulate contaminants to remain on the polished surface. The particulate materials are extremely difficult to remove. This is particularly problematic since the removal must not adversely affect the polished surface.

Furthermore, since the polishing slurries typically contain an oxidizing agent, an oxide layer usually is present on the copper due to oxidization of the copper during the CMP process. This layer may adversely affect the electrical characteristics of the device, and is preferably removed. In fact, this layer may also contribute to the contamination.

To date, no known processes exist for cleaning integrated circuit devices using copper as the interconnect material after chemical mechanical polishing.

Accordingly, a need exists for a post chemical mechanical polishing cleaning chemistry that removes metallic and particulate contamination. In addition, the cleaning step removes any residual copper oxides and/or other non-desirable surface films, leaving a bare copper surface.

The problems of developing such a cleaning is further exacerbated by the need to minimize etching of the copper as well as avoiding increased surface roughness to any significant extent.

SUMMARY OF THE INVENTION

The present invention related to an acidic aqueous solution that is especially for cleaning metallic/metal ion contaminants and especially metal and non-metal oxide particles remaining at or in the surface of a semiconductor wafer following CMP.

The present invention is particularly useful for removing particulate contaminants from copper. The present invention also removes any residual oxide layer found on the copper surface without etching or increasing the surface roughness of the copper to any significant extent.

In particular, the present invention relates to an aqueous composition comprising about 0.5% to about 5% by weight of a fluoride containing material, about 0.05% to about 1% by weight of at least one dicarboxylic acid, salt thereof or mixture thereof; about 0.5% to about 5% by weight of a hydroxycarboxylic acid, salt thereof or mixture thereof and the remainder being substantially water, and having a pH of about 3.0 to about 5.7.

A further aspect of the present invention is concerned with a process for removing particulate contaminants from a copper surface after CMP planarization. In particular, the process comprises contacting a copper surface that has been planarized by CMP with an aqueous composition comprising a fluoride containing material; at least one dicarboxylic acid, salt thereof or mixtures thereof; and at least one hydroxycarboxylic acid, salt thereof, or mixture thereof, and having a pH of about 3.0 to about 5.7.

A still further aspect of the present invention relates to a process for fabricating semiconductor integrated circuits. The process comprises forming circuits on the surface of a semiconductor wafer by photolithographic process wherein the circuits comprise copper or copper alloy; planarizing the surface by chemical mechanical polishing; and removing particulate and metallic (e.g.—metal ion) contaminants from the surface by contacting with an aqueous composition comprising fluoride containing material; at least one dicarboxylic acid, salt thereof or mixture thereof; and at least one hydroxy carboxylic acid, salt thereof or mixture thereof and having a pH of about 3.0 to about 5.7.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

DESCRIPTION OF BEST AND VARIOUS MODES FOR CARRYING OUT INVENTION

A number of criteria must be considered to establish an acceptable wafer cleaning process. In particular, the ideal cleaning process should reduce particulate and metallic contaminants on the wafer to the level present before the polishing step. Also, the cleaning process and chemistry must be compatible with the materials exposed on the wafer surface after CMP. Furthermore, one should be able to perform the cleaning process safely using commercially available wafer or fabrication equipment. Moreover, it is desirable that the process be relatively inexpensive to implement.

The structures treated pursuant to the present invention are typically semiconductor devices having copper interconnects (lines, plugs, vias, global and local interconnects) imbedded into a low k dielectric material such as silicon dioxide, which may also include a capping layer, such as silicon nitride as in low k dielectric/damascene and dual damascene structures. The silicon dioxide is typically a high density plasma deposited silicon dioxide or TEOS (tetraethylorthosilicate).

The copper interconnects typically use either tantalum, tantaium nitride, or titanium or titanium nitride as a barrier or liner material between the copper and the dielectric. As such, the post-CMP cleaning solution is meant to clean up to four or more different materials, copper, the liner material, the dielectric or capping layer, as well as the wafer backside, which is generally a thin layer of oxidized silicon. All these types of materials are exposed on the surface of the semiconductor device during post-CMP cleaning. Accordingly, the cleaning composition must not adversely effect any of these materials to an undesired degree while still effectively removing the contaminants. This places considerable constraints upon developing a suitable composition.

The copper is planarized after deposition by chemical mechanical polishing typically employing an aqueous slurry comprising an abrasive and an oxidizing agent. Such compositions are well known and need not be described in any detail herein. Examples of some chemical mechanical polishing slurries can be found in U.S. Pat. No. 5,527,423 and U.S. Pat. No. 5,693,239, and PCT publication WO 97/43087, disclosures of which are incorporated herein by reference.

The structure is then contacted with the aqueous composition according to the present invention. The composition comprises a fluoride containing material; at least one dicarboxylic acid and/or salt thereof; and at least one hydroxycarboxylic acid and/or salt thereof.

Typical compounds providing a fluoride ion source according to the present invention are ammonium fluoride or hydrofluoric acid. Other compounds which may provide a source of fluoride ion include, for example, metal salts such as antimony (III/VI) fluoride, barium fluoride, tin (II) fluoride, aluminum (III) fluoride, and fluoroborate compounds. Still other sources of fluoride such as tetramethylammonium fluoride, as well as other organic compounds which could disassociate a fluoride ion in an aqueous media can be used. These other sources include fluoride salts of aliphatic primary, secondary, and tertiary amines. Such have the following formula:

wherein $R_1$, $R_2$ and $R_3$ each individually represents H or an alkyl group.

Typically, the total number of carbon atoms in the $R_1$, $R_2$ and $R_3$ groups is 12 carbon atoms or less. The preferred fluoride compound is ammonium fluoride.

Typical dicarboxylic acids include those having two to six carbon atoms, and include oxalic acid, malonic acid, succinic acid, glutaric acid, adipic acid, maleic acid and fumaric acid. The preferred acid is malonic acid. Suitable salts include the alkali metal, alkaline earth metal and ammonium salts.

Examples of hydroxycarboxylic acids includes malic acid, tartaric acid and citric acid.

The preferred hydroxycarboxylic acid is citric acid. Suitable salts include alkali metal, alkaline earth metal and ammonium salts.

A preferred derivative is ammonium citrate.

In addition to water, the composition can include minor amounts of a surface active agent. Suitable surface active agents include anionic, cationic, nonionic and zwitterionic compounds. Examples of some surfactants for use in the present invention are disclosed in, for example, Kirk-Othmer, *Encyclopedia of Chemical Technology, 3rd Edition*, Vol. 22 (John Wiley & Sons, 1983), Sislet & Wood, *Encyclopedia of Surface Active Agents* (Chemical Publishing Co., Inc. 1964), McCutcheon's *Emulsifiers & Detergents, North American and International Edition* (McCutcheon Division, The MC Publishing Co., 1991), Ash, *The Condensed Encyclopedia of Surfactants* (Chemical Publishing Co., Inc., 1989), Ash, *What Every Chemical Technologist Wants to Know About . . . Emulsifiers and Wetting Agents*, Vol. 1 (Chemical Publishing Co., Inc., 1988), Tadros, *Surfactants* (Academic Press, 1984), Napper, *Polymeric Stabilization of Colloidal Dispersion* (Academic Press, 1983) and Rosen, *Surfactants & Interfacial Phenomena,* 2nd Edition (John Wiley & Sons, 1989), all of which are incorporated herein by reference. A typical example is an alkyl poly(ethylene oxide) non-ionic surfactant.

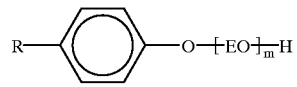

The compositions typically contain about 0.5 to 5 weight % and preferably about 0.6 to about 1.3 weight % of the fluoride containing compound.

The dicarboxylic acid and/or salt is typically present in amounts of about 0.05 to about 1 weight %, and preferably about 0.05 to about 0.2 weight %.

The hydroxycarboxylic acid is typically present in the composition at amounts of about 0.5% to about 5% by weight and preferably about 0.5 to about 2% by weight.

When present, the level of surface active agent in the composition is typically between about 50 and about 3,000 ppm, a specific example being about 500 ppm.

In addition, the compositions of the present invention have a pH of about 3.0 to about 5.7 and preferably about 3.5 to about 5.4, a particular example being about 4.0. The pH is typically measured using pH paper or suitable pH reference electrode. It has been discovered according to the present invention that the pH is important in achieving objectives of the present invention. In particular, the compositions are capable of removing metallic and non-metallic particulate oxides, as well as silicon dioxide; metal ion contaminants such as K, Ca, Ti, Cr, Mn, Fe, Ni, Cu and Zn; various sulfur and chloride impurities adsorbed on the various surface materials present on the wafer. CuO is thermodynamically unstable within the pH range of the compositions of the present invention. The removal is achieved while only slightly etching the metallic copper such as less than 5 angstrom/minute and etching dielectric such as high density plasma deposited silicon oxides or TEOS at less than about 20 Å/min.

Some etching of the dielectric such as about 10 Å/min. to about 15 Å/min occurs during the cleaning process of the present invention. The slight etching results in undercutting of particles strongly adsorbed on the wafer surface, which assists in their removal. The slight etching also acts to assist in removal of adsorbed metal ion contaminants incorporated at shallow depths in the dielectric layer.

It has also been found that the compositions of the present invention do not increase the surface roughness of the copper to any significant extent. For example, AFM surface roughness (RMS) of copper on a blank copper film was 1.2 nanometers. On a blank copper film following CMP and cleaning in accordance with the present invention was 1.27 nanometers (RMS) (a minuscule increase in surface roughness).

A further feature of the present invention is that the composition even in concentrated form is relatively stable. For instance, concentrates of the composition comprising about 1 to about 20% by weight of the fluoride containing compound, about 1 to about 30% by weight of the hydroxycarboxylic acid, about 1 to about 10% by weight of the dihydroxy carboxylic acid and about 30 to about 50% by weight of water can be provided and transported to the end user, the user can then dilute it such as about a 19:1 dilution by weight at the process tool for convenience and for economical reasons.

The composition can be used in a double sided brush scrubber to clean whole wafers following a copper CMP polishing step. Moreover, such can be used in a megasonic bath or spray tool cleaning apparatus, or combination thereof.

The following non-limiting examples are presented to further illustrate the present invention.

EXAMPLE 1

A concentrate comprising about 960 grams of citric acid, about 80 grams of malonic acid, about 1,600 grams of 40% aqueous solution of ammonium fluoride, and about 1,360 grams of deionized water is prepared. The concentrate is then diluted 19:1 (by weight) with deionized water to formulate an aqueous cleaning mixture containing about 1.2 weight % of citric acid, about 0.1 weight % of malonic acid, about 2 weight % of 40% ammonium fluoride and about 96.7 weight % of water. The composition has pH of about 4.0 as measured using a calibrated antimony reference electrode or pH paper.

Wafers having copper lines imbedded into silicon dioxide and lines with a liner material are first subjected to CMP employing an aqueous slurry comprising about 2% by weight alumina, about 3% by weight of $H_2O_2$, with the remainder being water and minor additives.

After the CMP, the wafers are contacted with the above aqueous cleaning mixture.

EXAMPLE 2

In a cleaning experiment, 25 as-deposited TEOS coated wafers and 25 as-deposited copper coated wafers are pre-read for particle counts on the wafer surface using a Tencor 6420 light point defect (LPD) counter at $\geq 0.2$ µm particle size.

The wafers are then split up into two batches of 13 TEOS/12 copper and 12 TEOS/13 copper. Within each group, the TEOS wafers and copper wafers are alternated in a 25 wafer cassette.

The wafers are then dipped in Cabot 4110 alumina based slurry for 1 minute and buffed in DI water for 15 seconds. Immediately after the dip and buff step, the wafers are transferred to the Ontrak Synergy double sided brush scrubber cleaning tool. The wafers are cleaned using a flow rate of 500 ml/minute of a cleaning solution prepared according to Example 1 with a brush scrub cleaning time of 45 seconds in the first box, and 10 seconds in the second box. Finally, a 30 second DI spin rinse and blow dry to finish the clean.

After the cleaning step, the wafers are again inspected for particles using the Tencor LPD counter. Table 1 below presents the data obtained from the pre- and post-clean particle counts from the above tests. It may be seen that there is almost no adder particles at the $\geq 0.2$ µm level for both TEOS and copper wafers. The averaged adder particles for TEOS is −2.4+/−10. The averaged adder particles for copper is −185.1+/−155. It should be noted that the negative number of adders for the copper wafers is due to the fact that these as-deposited copper wafers might not be as clean as possible prior to the test.

After the clean, two TEOS wafers, #1 of batch #1, and #20 of batch #2, were sent out for TXRF analysis on the frontside (see 1 and 20 in Table 2). Two other TEOS wafers, #3 of batch #1, and #22 of batch #2 were sent out for TXRF analysis on the wafer backside (see 3 and 22 in Table 2). Table 2 presents the TXRF data from the analysis on wafer frontside or backside. This is to check if there is metal cross-contamination between copper and TEOS wafers, as well as metal contaminant removal performance on the wafer backside.

The TXRF analysis indicates metal levels at or below detection limits, except for K on the frontside. The K might be deeply embedded in the TEOS surface and thus hard to remove. The low level of metal contamination indicates that there is no metal cross-contamination between copper and TEOS wafers via the brush. In addition, there is no contamination to the wafer backside during the clean.

TABLE 1

Pre- and Post-LPD Counts $\geq 0.2$ µm (Copper and TEOS Wafers)
LPD = Light Point Defects

| Wafer # | Wafer Type | Pre- | Post- | Adder |
| --- | --- | --- | --- | --- |
| 1 | TEOS | 58 | 44 | −14 |
| 2 | CU | 626 | 729 | 103 |
| 3 | TEOS | 38 | 32 | −6 |
| 4 | CU | 1985 | 1546 | −439 |
| 5 | TEOS | 61 | 59 | −2 |
| 6 | CU | 2535 | 2083 | −452 |
| 7 | TEOS | 60 | 55 | −5 |
| 8 | CU | 2693 | 2247 | −446 |
| 9 | TEOS | 54 | 45 | −9 |
| 10 | CU | 2012 | 1779 | −233 |
| 11 | TEOS | 46 | 50 | 4 |
| 12 | CU | 2198 | 1927 | −271 |
| 13 | TEOS | 167 | 154 | −13 |
| 14 | CU | 1995 | 1716 | −279 |
| 15 | TEOS | 113 | 105 | −8 |
| 16 | CU | 1747 | 1530 | −217 |
| 17 | TEOS | 99 | 97 | −2 |
| 18 | CU | 1834 | 1571 | −263 |
| 19 | TEOS | 63 | 56 | −7 |
| 20 | CU | 706 | 771 | 65 |
| 21 | TEOS | 55 | 37 | −18 |
| 22 | CU | 1788 | 1612 | −176 |
| 23 | TEOS | 88 | 87 | −1 |
| 24 | CU | 2166 | 1915 | −251 |
| 25 | TEOS | 48 | 56 | 8 |
| 26 | CU | 559 | 557 | −2 |
| 27 | TEOS | 22 | 21 | −1 |
| 28 | CU | 1350 | 1111 | −239 |
| 29 | TEOS | 32 | 27 | −5 |
| 30 | CU | 841 | 674 | −167 |
| 31 | TEOS | 15 | 24 | 9 |
| 32 | CU | 569 | 469 | −100 |
| 33 | TEOS | 38 | 37 | −1 |
| 34 | CU | 796 | 560 | −236 |
| 35 | TEOS | 33 | 26 | −7 |
| 36 | CU | 769 | 513 | −256 |
| 37 | TEOS | 34 | 25 | −9 |
| 38 | CU | 1147 | 897 | −250 |
| 39 | TEOS | 23 | 26 | 3 |
| 40 | CU | 690 | 516 | −174 |
| 41 | TEOS | 50 | 40 | −10 |

TABLE 1-continued

Pre- and Post-LPD Counts ≧0.2 μm (Copper and TEOS Wafers)
LPD = Light Point Defects

| Wafer # | Wafer Type | Pre- | Post- | Adder |
|---|---|---|---|---|
| 42 | CU | 721 | 490 | −231 |
| 43 | TEOS | 46 | 42 | −4 |
| 44 | CU | 592 | 673 | 81 |
| 45 | TEOS | 27 | 29 | 2 |
| 46 | CU | 568 | 418 | −150 |
| 47 | TEOS | 15 | 49 | 34 |
| 48 | CU | 481 | 368 | −113 |
| 49 | TEOS | 39 | 41 | 2 |
| 50 | CU | 254 | 323 | 69 |

TABLE 2

Data from TXRF Analysis of Wafer Frontside and Backside Following Slurry Dip and Subsequent "Post-CMP" Clean (Units: $10^{10}$ atoms/cm$^2$)

| Wafer # | | K | Ca | Ti | Cr | Mn | Fe | Ni | Cu | Zn |
|---|---|---|---|---|---|---|---|---|---|---|
| 1 | frontside | 34 +/− 4 | <4 | <2 | <1 | <1 | 1.7 +/− 0.5 | <0.8 | <0.8 | 1.0 +/− 0.5 |
| 3 | backside | <4 | <3 | <1 | <0.7 | <0.6 | 0.9 +/− 0.3 | 0.6 +/− 0.2 | <0.5 | 1.5 +/− 0.3 |
| 20 | frontside | 9 +/− 3 | <4 | <2 | <1 | <1 | 2.4 +/− 0.5 | 1.0 +/− 0.4 | <0.8 | 1.7 +/− 0.5 |
| 22 | backside | <4 | <3 | <1 | <1 | <0.6 | <0.5 | <0.5 | <0.5 | 0.7+/− 0.3 |
| Det. Limits | | 4 | 3 | 1 | 0.7 | 0.6 | 0.5 | 0.5 | 0.5 | 0.7 |

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An aqueous composition comprising about 0.5% to about 5% by weight of fluoride containing material, about 0.05% to about 1% by weight of at least one dicarboxylic acid, salt thereof or mixture thereof;
   about 0.5 to about 5% by weight of at least one hydroxy carboxylic acid, salt thereof or mixture thereof; and the remainder being substantially water, and
   having a pH of about 3.0 to about 5.7.

2. The composition of claim 1 wherein the fluoride containing is selected from the group consisting of ammonium fluoride, hydrofluoric acid, antimony (III/VI) fluoride, barium fluoride, tin (II) fluoride, aluminum (III) fluoride, fluoroborates, tetramethylammonium fluoride, and fluoride salts of aliphatic primary, secondary and tertiary amine having the formula:

wherein $R_1$, $R_2$ and $R_3$ each individually represents H or an alkyl group having 12 carbon atoms or less.

3. The composition of claim 1 wherein the fluoride containing compound is selected from the group consisting of ammonium fluoride or hydrofluoric acid.

4. The composition of claim 1 wherein the fluoride containing compound is ammonium fluoride.

5. The composition of claim 1 wherein the dicarboxylic acid or salt thereof has two to six carbon atoms.

6. The composition of claim 1 wherein the dicarboxylic acid is selected from the group consisting of oxalic acid, malonic acid, succinic acid, glutaric acid, adipic acid, maleic acid and fumaric acid.

7. The composition of claim 1 wherein the dicarboxylic acid is malonic acid.

8. The composition of claim 1 wherein the hydroxy carboxylic acid is selected from the group consisting of malic acid, tartaric acid and citric acid.

9. The composition of claim 1 which comprises citric acid or ammonium citrate.

10. The composition of claim 1 which comprises citric acid.

11. The composition of claim 1 which comprises ammonium citrate.

12. The composition of claim 1 comprising ammonium fluoride, malonic acid and citric acid.

13. The composition of claim 1 having a pH of about 3.5 to about 5.4.

14. The composition of claim 1 wherein the amount of fluoride containing material is about 0.6 to about 1.3% by weight.

15. The composition of claim 1 wherein the amount of dicarboxylic acid is about 0.05 to about 0.2% by weight.

16. The composition of claim 1 wherein the amount of hydroxy carboxylic acid is about 0.5 to about 2% by weight.

17. The composition of claim 1 which further comprises a surface active agent.

18. The composition of claim 1 wherein the amount of surface active agent is about 50 ppm to about 3000 ppm.

19. A process for removing particulate contaminants from a copper surface after CMP planarization which comprises contacting a copper surface that has been planarized by CMP with an aqueous composition comprising a fluoride containing material;
   at least one dicarboxylic acid, salt thereof or mixtures thereof; and
   at least one hydroxycarboxylic acid, salt thereof or mixtures thereof, and having a pH of about 3.0 to about 5.7.

20. A process for fabricating semiconductor integrated circuits comprising:
   forming circuits on the surface of a semiconductor wafer by photolithographic process wherein the circuits comprise copper or copper alloy;
   planarizing the surface by chemical mechanical polishing;

and removing particulate contaminants from the surface by contacting with a aqueous composition comprising fluoride containing material;

at least one dicarboxylic acid, salt thereof or mixture thereof; and at least one hydroxy carboxylic acid, salt thereof or mixtures thereof and having a pH of about 3.0 to about 5.7.

21. The process of claim 20 wherein the copper or copper alloy is imbedded into a dielectric material and wherein a barrier layer is present between the dielectric material and copper or copper alloys.

22. The process of claim 20 wherein the dielectric is silicon dioxide and the barrier layer is at least one material selected from the group consisting of: tantalum, titanium, and nitrides thereof.

23. An aqueous composition comprising about 1 to about 20% by weight of the fluoride containing material;

about 1 to about 10% by weight of a dicarboxylic acid, salt thereof, or mixtures thereof;

about 1 to about 30% by weight of a hydroxy carboxylic acid;

salt thereof or mixtures thereof, and 30 to about 50% by weight or water.

* * * * *